(12) United States Patent
McKee et al.

(10) Patent No.: US 6,652,989 B2
(45) Date of Patent: Nov. 25, 2003

(54) STRUCTURE AND METHOD FOR CONTROLLING BAND OFFSET AND ALIGNMENT AT A CRYSTALLINE OXIDE-ON-SEMICONDUCTOR INTERFACE

(75) Inventors: Rodney A. McKee, Kingston, TN (US); Frederick J. Walker, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/910,322

(22) Filed: Jul. 20, 2001

(65) Prior Publication Data

US 2001/0049029 A1 Dec. 6, 2001

Related U.S. Application Data

(60) Continuation-in-part of application No. 09/650,340, filed on Aug. 28, 2000, now Pat. No. 6,287,710, which is a division of application No. 09/286,798, filed on Apr. 6, 1999, now Pat. No. 6,143,072.

(51) Int. Cl.[7] ............................................. B32B 9/00
(52) U.S. Cl. ..................... 428/633; 428/632; 428/702
(58) Field of Search ....................... 428/699, 701, 428/702, 620, 641, 633, 632

(56) References Cited

U.S. PATENT DOCUMENTS 5,830,270 A    11/1998   McKee et al.
6,241,821 B1 * 6/2001   Yu et al. ...................... 117/108
6,248,459 B1 * 6/2001   Wang et al. ................ 428/446

OTHER PUBLICATIONS

The American Heritage Dictionary of the English Language, Third Edition, "commensurate", Houghton Mifflin Company, 1992.*

* cited by examiner

Primary Examiner—Deborah Jones
Assistant Examiner—Arden Sperty
(74) Attorney, Agent, or Firm—Michael E. McKee

(57) ABSTRACT

A crystalline oxide-on-semiconductor structure and a process for constructing the structure involves a substrate of silicon, germanium or a silicon-germanium alloy and an epitaxial thin film overlying the surface of the substrate wherein the thin film consists of a first epitaxial stratum of single atomic plane layers of an alkaline earth oxide designated generally as $(AO)_n$ and a second stratum of single unit cell layers of an oxide material designated as $(A'BO_3)_m$ so that the multilayer film arranged upon the substrate surface is designated $(AO)_n(A'BO_3)_m$ wherein n is an integer repeat of single atomic plane layers of the alkaline earth oxide AO and m is an integer repeat of single unit cell layers of the $A'BO_3$ oxide material. Within the multilayer film, the values of n and m have been selected to provide the structure with a desired electrical structure at the substrate/thin film interface that can be optimized to control band offset and alignment.

12 Claims, 3 Drawing Sheets

FIG. 4
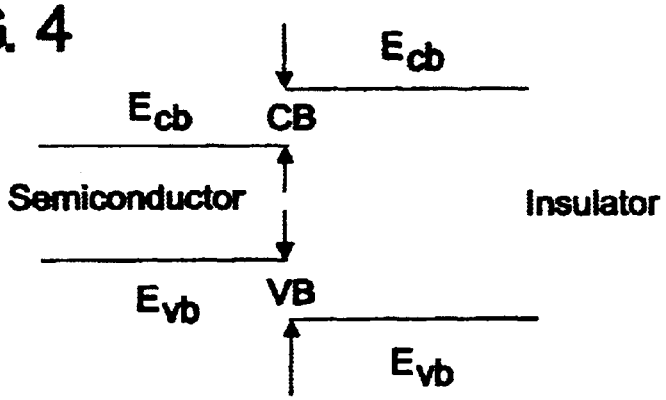
FIG. 5
| | CNL | Band Gap | $CB_{Ge}$ | $VB_{Ge}$ | $CB_{Si}$ | $VB_{Si}$ |
|---|---|---|---|---|---|---|
| Si | 0.36 | 1.1 | | | | |
| Ge | 0.18 | 0.6 | | | | |
| $SrTiO_3$ | 2.6 | 3.3 | +0.18 | +2.42 | −0.14 | +2.4 |
| BaO | 2.5 | 5 | +2.1 | +2.3 | +1.26 | +2.1 |
FIG. 6
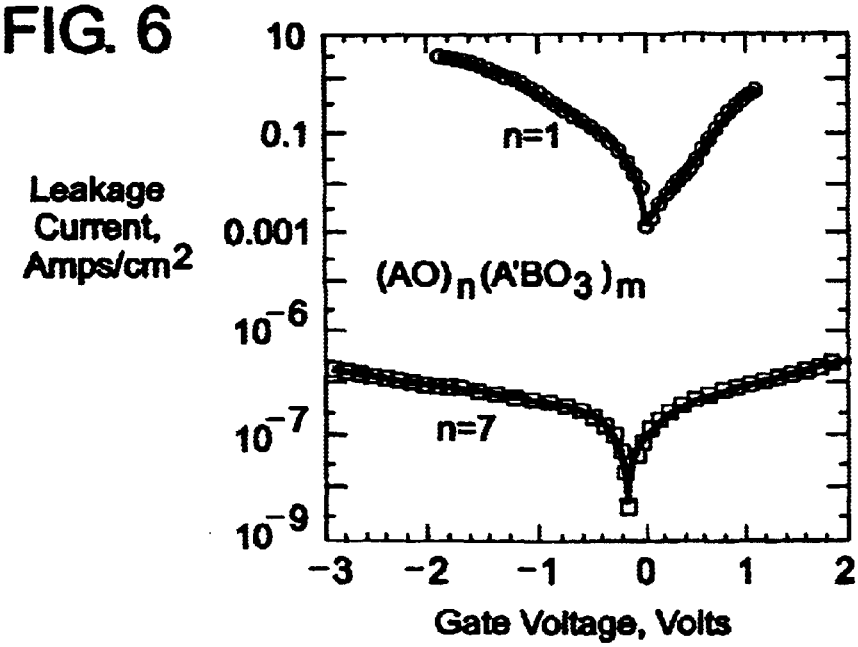

STRUCTURE AND METHOD FOR CONTROLLING BAND OFFSET AND ALIGNMENT AT A CRYSTALLINE OXIDE-ON-SEMICONDUCTOR INTERFACE

This application is a continuation-in-part application of application Ser. No. 09/650,340, filed Aug. 28, 2000 now U.S. Pat. No. 6,287,710 which, in turn, is a divisional of application Ser. No. 09/286,798, filed Apr. 6, 1999, now U.S. Pat. No. 6,143,072. The disclosures of these related applications are incorporated herein by reference.

This invention was made with Government support under Contract No. DE-AC05-00OR22725 awarded by the U.S. Department of Energy to UT-Battelle, LLC, and the Government has certain rights in the invention.

BACKGROUND OF THE INVENTION

This invention relates to the structure of electronic devices, such as capacitors and transistors, embodying a thin film which has been grown upon a semiconductor substrate and more particularly is concerned with the electrical characteristics of such structures when embodied in electronic devices.

We have described in our prior U.S. patents, such as U.S. Pat. No. 5,830,270, various processes for constructing thin films upon a semiconductor substrate with few, if any, dislocations or other undesirable defects at the thin-film/substrate interface. Some of our construction processes involve a layer-by-layer build up of an epitaxial, and sometimes commensurate, oxide upon the substrate (i.e., a crystalline oxide-on-semiconductor substrate, or COS, structure) wherein each layer in the build up process is comprised of a constituent plane of the oxide. For example, in our U.S. Pat. No. 5,830,270, we describe a build-up of a perovskite oxide upon a substrate as having the general formula $(AO)_n(A'BO_3)_m$ wherein which n and m are the non-negative integer repeats of single oxide layers. The element O in the formula represents oxygen, while the element A (or A') can be a material found in Group IA, IIA or IVB of the periodic table of elements and the element B can be a material found in Group III, IVA or VA of the periodic table of elements. Moreover, the composition of each element A (or A') or B is not limited to a single material, but instead can be comprised of a mixture or alloy of materials.

While perfecting techniques to construct crystalline oxide-on-semiconductor (COS) structures, however, little attention has been given to the electrical behavioral characteristics of electronic devices within which such COS structures are embodied. It would be desirable to provide a COS structure for use in an electronic device wherein the physical structure, or physical characteristics, of the COS structure impart desired electrical structure, or electrical behavioral characteristics to the structure.

Accordingly, it is an object of the present invention to provide such a COS structure which is physically constructed so that desired, or predetermined, electrical structure is imparted to the COS structure and an associated method of making such a structure.

Another object of the present invention is to provide such a COS structure whose construction is controlled to impart a desired, or predetermined, band offset parameter to the structure.

A further object of the present invention is to provide such a structure which incorporates a perovskite oxide for the gate oxide of an electronic device and wherein the band gap at the oxide/substrate interface is relatively small.

A still further object of the present invention is to provide a method of making such a structure wherein the deposition steps are carried out at low temperature (e.g. between room temperature and 400° C.).

SUMMARY THE INVENTION

This invention resides in a crystalline oxide-on-semiconductor structure and a process for making the structure.

The crystalline oxide-on-semiconductor structure includes a semiconductor-based substrate and an epitaxial thin film overlying the surface of the substrate wherein the thin film consists of a first stratum of single atomic layers of an alkaline earth oxide (AO) and a second stratum of single unit cell layers of an oxide material ($A'BO_3$) so that the multilayer thin film arranged upon the substrate surface can be designated $(AO)_n(A'BO_3)_m$ wherein n is an integer repeat of single atomic layers of the AO alkaline earth oxide and m is an integer repeat of unit cell layers of the $A'BO_3$ oxide material. In addition, the values of n and m in the general formula of the thin film have been selected to provide the physical structure of the structure with a desired, or predetermined, electrical structure, or characteristic, at the substrate/thin film interface.

In the process for making the structure of the invention, the values of n and m are selected prior to the build up of n layers of AO alkaline earth oxide and m layers of the $A'BO_3$ oxide material upon the substrate so that the resultant crystalline oxide thin film is provided with predetermined electrical characteristics at the substrate/thin-film interface.

BRIEF DESCRIPTION OF THE DRAWINGS

FIG. 4 is a schematic representation of the Schottky barrier for a semiconductor/insulator interface.

FIG. 5 is a table setting forth valence and conduction band offset parameters for COS structures on silicon and germanium.

FIG. 6 is a graph setting forth leakage current data for an $(AO)_n(A'BO_3)_m$ oxide material on germanium.

DETAILED DESCRIPTION OF THE ILLUSTRATIVE EMBODIMENTS

Figure 1:
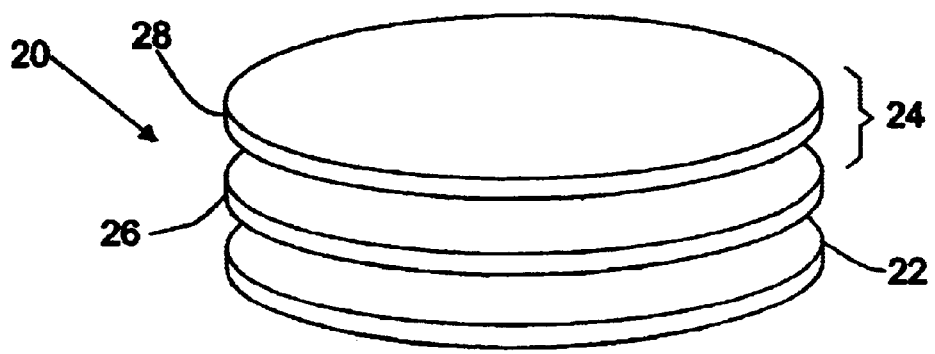
FIG. 1 is a perspective view of an embodiment of a structure, shown exploded, which has been constructed in accordance with an embodiment of the process of the present invention.

We have described in our previous patents, such as U.S. Pat. No. 5,830,270, our general series of crystalline oxide-on-semiconductor series (COS) as being designated by the general formula $(AO)_n(A'BO_3)_m$. Within this general formula, the terms n and m are non-negative integer repeats of single layers of the oxide AO or the oxide $A'BO_3$ which are constructed upon a semiconductor-based substrate, such as the Group IVA semiconductors silicon, germanium or a silicon-germanium alloy. Whereas each layer of the oxide AO in such a structure is planar in nature in that it has a height, or thickness, which is about equal to the height of a single AO plane, each layer of the oxide A'BO$_3$ has a height, or thickness, which is about equal to the height of one unit cell of the A'BO$_3$ oxide.

Moreover, the element O in the general formula represents oxygen, while the element A (or A') can be a material found in Group IA, IIA or IVB of the periodic table of elements and the element B can be a material found in Group III, IVA or VA of the periodic table of elements. When the elements A and B are compared to one another, the element A provides a large cation in the crystalline structure of the material and the element B provides the small cation in the crystalline structure of the material. The A' of the formula can, where AO is a single atomic layer, be the same element A of the alkaline earth oxide AO having the sodium chloride-type lattice structure but can, in some instances, be an element other than the element A. Therefore, the second term of the formula is appropriately designated A'BO$_3$ to differentiate, where in the case of a single atomic layer of AO, that the element A is different from the element A' of the constituent oxide A'O of the A'BO material. It will therefore be understood that in the interests of the present invention, the element A' of the formula A'BO material can consist of, but is not limited to, the element A of the alkaline earth oxide AO. It should also be understood that the element A (or A') or B can be a mixture or an alloy of more than one material, such as would be the case if A were Ba$_{0.75}$Sr$_{0.25}$ —wherein each of the materials Ba and Sr are of the alkaline oxide series.

It follows from the foregoing that while the aforedescribed structure series can be quite broadly stated, it will be discussed hereinafter for cases where A and A' are elements or combination of elements out of Group IIA of the periodic table (i.e., Ba, Sr, Ca and Mg), and B is a Group IVA transition metal like Ti or Zr.

We have discovered that by manipulating the values of n and m during the build up of our COS structures (having the aforedescribed general formula), desirable electrical structure, or behavior, can be imparted to the resultant structure. In particular, by manipulating the values of n and m in the COS structure series (AO)$_n$(A'BO$_3$)$_m$, the band parameters (i.e., the band offset and alignment) can be altered accordingly. The advantage provided in this regard relates to the fact that by manipulating the band offset and alignment enables the resulting COS structure, when used as a COS dielectric in an electronic device such as a capacitor or a transistor, to act as an effective barrier to both electron and hole transport in the device.

With reference to FIG. 1, there is shown a structure, generally indicated 20, embodying the principle components of the structure of the present invention. In particular, the structure 20 includes a semiconductor-based substrate 22 and an epitaxial thin film build-up 24 overlying the surface of the substrate 22. The thin film 24 is comprised of a first epitaxial stratum 26 of single plane layers of an alkaline earth oxide having the above-described general formula AO and a second epitaxial stratum 28 of single layers (i.e. of unit cell height) of an oxide, such as a perovskite, having the above-described general formula A'BO$_3$. Hence, the FIG. 1 structure 20 can be described by the general formula (AO)$_n$(A'BO$_3$)$_m$ as described above.

Although we have described the oxide material A'BO$_3$ in our general COS series of structures relatively broadly, in the interests of the present invention, the oxide material A'BO$_3$ is preferably a perovskite (because of the desirable electrical, e.g. ferroelectric and dielectric, qualities of that material in a COS structure).

Figure 2:
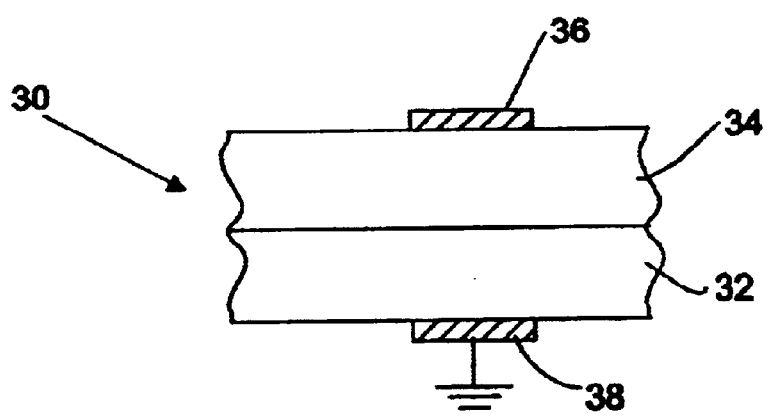
FIG. 2 is a schematic cross-sectional view of a capacitor employing a structure like that of FIG. 1.
Figure 3:
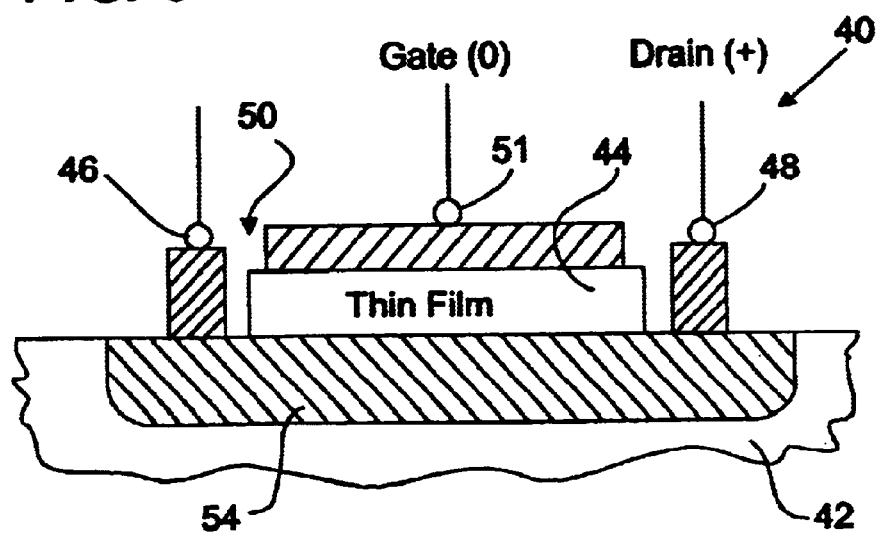
FIG. 3 is a schematic cross-sectional view of a ferroelectric field effect transistor (FFET) employing a structure like that of FIG. 1.

With reference to FIG. 2, there is illustrated a capacitor 30 providing one example of an electronic structure within which the structure, like the structure 20 of FIG. 1, can be embodied. The capacitor 30 is of a class capable for use in a dynamic random access memory (DRAM) circuit and its structure has been constructed in accordance with the process of the present invention so that predetermined electrical characteristics are imparted to the capacitor 30. In this connection, the depicted capacitor 30 includes a substrate 32 of a semiconductor-based material and an oxide (dielectric) layer 34 which are in superposed relationship with one another and which are sandwiched between a gate 36 and a ground terminal 38. In use, the information-providing signal is collected from the capacitor 30 by measuring the current of the capacitor 30 during a discharge cycle. Within the depicted capacitor 30, the oxide layer 34 is the COS thin film whose numbers (i.e., the values of n and m) of single oxide layers have been manipulated or selected prior to the build-up thereof so as to provide the desired electrical characteristics at the substrate/thin film interface.

Similarly and with reference to FIG. 4, there is illustrated a transistor 40 providing another example of an electronic structure within which the structure, like the structure 20 of FIG. 1, can be embodied. In particular, the transistor 40 is a ferroelectric field effect transistor (FFET) including a base, or substrate 42, of semiconductor-based material, and a thin film (COS) overlayer 44 comprising a stratum of alkaline oxide layers and a stratum of perovskite material. The transistor 40 is also provided with a source electrode 46, a drain electrode 48, a gate electrode 51 and a gate dielectric 50. The COS thin film 44 (which comprises part of the gate dielectric 50) is sandwiched between the epilayer 54 (which comprises part of the substrate 42) and the remainder of the gate dielectric 50 so as to be positioned adjacent the epilayer 54. Within the depicted transistor 40, it is the thin film overlayer 44 that is the COS thin film whose numbers (i.e., the values of n and m) of single layers have been manipulated or selected prior to the build-up thereof so as to provide the desired electrical characteristics at the substrate/thin film interface.

Our COS technology offers an interface physics approach to the development of new gate dielectrics for transistor technology through epitaxial growth of the oxides. Moreover, this heteroepitaxial approach allows us to systematically manipulate interface band structure as well as interface charge. As will be apparent, we present herein experimental data obtained from MOS capacitors to demonstrate these ideas directly.

The surface potential, interface charge and inversion charge in the semiconductor of the MOS capacitor are all functions of bias voltage and frequency. Device function for the MOS capacitor requires that the oxide dielectric act as a Schottky barrier with no free charge and support the dielectric displacement that sets up the inversion charge in the underlying semiconductor. This coupling of dielectric displacement to inversion charge is critically dependent on the details of the interface band structure of the MOS capacitor.

It has been predicted that while a number of the oxides in the perovskite class have the desired high dielectric constants, band offset and alignment are highly unfavorable; namely the barrier height to electron transfer across a perovskite dielectric on silicon can be small or even nonexistent.

As an aid to the understanding of the present invention, there is illustrated in FIG. 4 a schematic band diagram illustrating positive conduction (CB) and valance (VB) offset parameters at a semiconductor/dielectric (or insulator) interface which thereby reflects the hole and electron states at the semiconductor/dielectric interface. Simply stated and with reference to the FIG. 4 diagram, the band alignment relates to the relationship (e.g. up or down relationship as shown in FIG. 4) between corresponding parameters, such as the $E_{cb}$ of the semiconductor and the $E_{cb}$ of the insulator, and the band offset relates to the magnitude of the difference between corresponding parameters, such as the $E_{cb}$ of the semiconductor and the $E_{cb}$ of the insulator. While this FIG. 4 diagram is used here to demonstrate generalities, the interface electrical characteristics involved here are a principle facet of the physics base of the crystalline oxide-on-semiconductor (COS) system described herein. Along the same lines, the charge neutrality level, CNL, is the energy level in the semiconductor (or the insulator) density of states above which allowable states are empty. In a p-type semiconductor for instance, the probability of an electron hole escaping from the conduction band of the semiconductor to unfilled insulator states is related to CB, and conversely, the probability for an electron hole escaping from the semiconductor to the valence band of the insulator is related to VB. In either case, for the insulator to support field effect inversion of charge in the semiconductor, CB and VB must be positive (i.e. greater than zero) for the electron or hole-conducting channel. For transistor logic, it is desirable that CB be as high as 1.0 eV.

The relationship between valance band and conduction band offsets shown of an oxide can be expressed (mathematically) in terms of the charge neutrality level (CNL) of the oxide as $$VB = CNL_{oxide} - CNL_{Ge,Si}$$

and $$CB = (E_{g,oxide} - CNL_{oxide}) - (E_{g,ge,Si} - CNL_{Ge,Si})$$

With reference to FIG. 5 there is shown a table providing representative, and in some cases estimated, values for valence and conduction band offset parameters for COS thin film structures on silicon and germanium substrates. The values provided for $SrTiO_3$ (typical of the simple perovskites $SrTiO_3$, $CaTiO_3$ and $BaTiO_3$) show that p-channel field effect transistors on germanium or silicon substrates have positive values for VB, but CB is only slightly positive on germanium and is negative for silicon. Given these parameters, an n-channel FET would not switch.

This asymmetry in band offset is attributable to the fact that the band gap for transition metal perovskites lies between the valence band of filled oxygen 2p states and the conduction band of empty transition metal d states. The weighting of the transition metal d-states that the integrated CNL drives is thus responsible for the asymmetry. It is here that the physics-base for the COS approach to transistor gate dielectrics can be clearly illustrated.

As mentioned earlier, our COS structure series $(AO)_n (A'BO_3)_m$ allows the band structure to be systematically manipulated so that a COS structure is provided with predetermined valence and conduction band parameters. Unlike the transition metal perovskites, the alkaline earth oxides like BaO are strongly ionic and the charge neutrality level is in the middle of the band gap. With reference to FIG. 5 wherein there is provided representative values of valance and conduction band offset parameters for COS structures on silicon and germanium, we have estimated the entries in FIG. 5 for BaO assuming the mid-gap CNL and clearly show that band offsets, both CB and VB, are substantially positive for germanium (substrate material) and for silicon (substrate material). Therefore, if two or more BaO planes are inserted between a perovskite and germanium or silicon, then the asymmetry of the band structure would, according to the numbers provided in FIG. 5, adjust and support dielectric displacement across the junction. This is a simple and striking prediction for our heteroepitaxial approach.

With reference to FIG. 6, there is provided a collection of leakage current data obtained for $BaTiO_3$ on germanium with two values of the AO repeat, i.e., wherein n=1 and n=7. In the case where n=1, bulk $BaTiO_3$ grown upon the germanium substrate does not provide an effective barrier to electron transfer. By comparison, if as few as six atomic planes of BaO are grown upon the germanium substrate before the $BaTiO_3$ is grown in bulk, then the leakage current drops six orders of magnitude. This is dramatic evidence for physical structure dominance of the electrical structure in our heteroepitaxial oxide series. Within the context of the generality of our structure series and its n/m (ratio) configuration, interface band structure can be adjusted for many perovskite and transition metal oxides. By way of example and not as limitation, the perovskite and transition metal oxides to which the principles of this invention can be applied include: $BaTiO_3$, $SrTiO_3$, $PbTiO_3$, $BaZrO_3$, $PbZrO_3$, $Ta_2O_5$, $SrBi_2Ta_2O_9$, and $TiO_2$.

The aforedescribed change in the band offset of $BaTiO_3$ on germanium by altering the value of n in the structure build up of $(AO)_n(A'BO_3)_m$ onto germanium (as demonstrated in FIG. 6) is analogous to a change in the band offset of $SrTiO_3$ on silicon.

It follows therefore that by selecting the number of atomic layers (i.e., n) of the alkaline earth oxide AO deposited upon the surface of the substrate and then depositing m unit cell layers of the $A'BO_3$ oxide material, a predetermined electrical characteristic (e.g. the band gap parameter) at the substrate/thin film interface can be imparted to the resulting structure. In other words, the values provided in FIG. 5 can be used in the design of a COS structure (like the structure 20 of FIG. 1) to provide the COS structure with desired, or predetermined, band gap parameters and thereby dictate desired, or predetermined, physical and electrical characteristics in an electronic device within which the structure is incorporated. For example and with reference again to FIG. 5, the insertion of BaO between the perovskite $SrTiO_3$ and a corresponding substrate of silicon or germanium imparts a band offset in the resulting structure which is greater than zero.

Figure 7A:
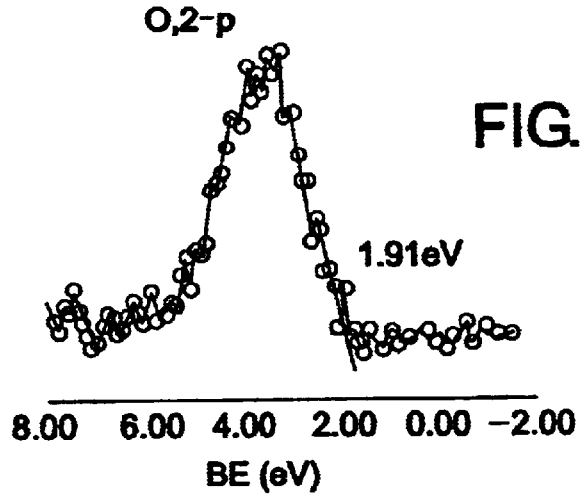
FIGS. 7a and 7b are diagrams disposed in registry with one another and on which is plotted test results showing valance band spectra and an energy band diagram for BaSrO on silicon.
Figure 7B:
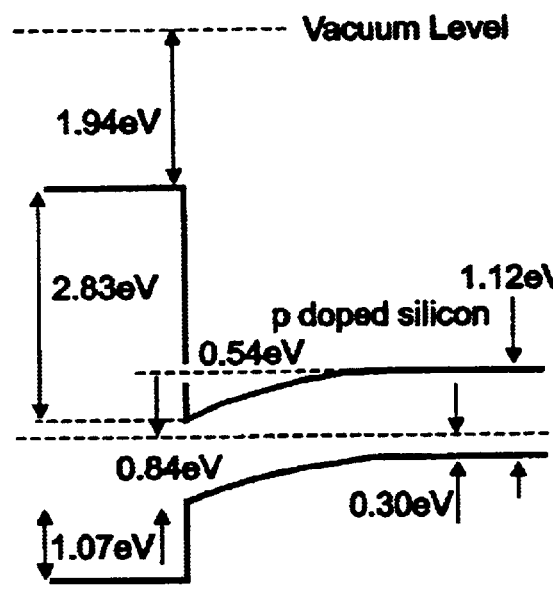

With reference to FIGS. 7a and 7b, there is plotted test results showing valance band spectra and an energy band diagram for BaSrO on silicon. In this connection, FIG. 7a sets forth XPS (X-ray photoelectron spectroscopy) data for the O2p valence band for n=6 in the structure series representation. Within the FIG. 7a plot, the valence band edge is 1.91 eV from the Fermi level of silicon. Meanwhile, FIG. 7b (with which the FIG. 7a data is positioned in vertical registry) is the energy band diagram illustrating band offset data for the dielectric/semiconductor structure. The conduction band offset is 2.83 eV and the valence band offset is 1.07 eV. Numbers are deduced assuming the band gap of silicon is 1.12 eV/and the band gap of BaSrO is 5 eV.

Construction of an Exemplary COS Structure

A description of an exemplary COS structure (like that of the FIG. 1 structure 20) having the general formula $(AO)_n$ (A'BO$_3$)$_m$—wherein the alkaline earth oxide AO is barium oxide (BaO), the A'BO$_3$ oxide material is barium titaniate (BaTiO$_3$), and the substrate upon which the COS material is deposited is germanium—will now be addressed. We have already described in our co-pending patent application Ser. No. 09/650,340 a commensurate build up of bulk BaTiO$_3$ on germanium with single plane layers of the alkaline earth oxide BaO interposed between the germanium substrate and the bulk BaTiO$_3$, so that a detailed description of various specifics of the build-up process is not believed to be necessary. It will be understood, however, that before a build up of any (AO)$_n$(A'BO$_3$)$_m$ series onto a semiconductor-based substrate is initiated, regard must be given to the lattice parameters of the component materials of the desired structure to ensure that a good lattice match-up exists at the substrate/AO material and the AO/A'BO$_3$ material interfaces.

For example and in this respect, the semiconductor alloy series from pure silicon to pure germanium has its room temperature cubic lattice parameter varying from 5.43 Å to 5.65 Å. The perovskites CaTiO$_3$, SrTiO$_3$ and BaTiO$_3$ are simple cubic "2-4" perovskite structures in which the 2+ alkaline earth metal ions occupy the cube corners and the 4+ transition metal is octahedrally coordinated in the face-centered sites of the unit cell. These three perovskites are mutually soluble in each other by mixing Ca and Sr, for instance, in a 60/40 ratio, the 5.43 Å lattice parameter of pure silicon can be obtained at room temperature since the perovskites rotate 45° so that the [100] direction in the oxide is parallel with [110] Si and its 3.84 Å spacing. The lattice parameters of two pure perovskites are of particular note in that pure BaTiO$_3$ matches the 5.65 Å lattice parameter of pure germanium at room temperature and pure CaTiO$_3$ matches the 5.44 Å lattice parameter of pure silicon at 515° C. No alloying is required for either of these two perovskites for growth on the two end members of a Si—Ge substrate series.

Turning again to a description of a build up of (BaO)$_n$(BaTiO$_3$)$_m$ onto a substrate of germanium (to simulate the FIG. 1 structure 20), steps are taken to deposit a fraction of a monolayer of the alkaline earth metal Ba upon the germanium substrate, and then steps are taken to deposit Ba and O upon the germanium until an entire monolayer of BaO has been formed upon the substrate, then steps are taken to deposit (additional) single plane layers of BaO upon the first monolayer of BaO until the deposition of the desired number (i.e., n) layers of BaO have been completed, and then steps are taken to deposit an overlayer of the perovskite BaTiO$_3$ upon the stratum of BaO layers. The deposition of a fraction of a monolayer of Ba over the germanium effects the reaction of the Ba with the germanium of the substrate to form a monolayer of germanide which, in turn, passivates the substrate surface against the subsequent reaction with oxygen.

At the outset of a build-up process to deposit (at least one single plane layer of) BaO onto the germanium substrate (and subsequently to deposit BaTiO$_3$ onto the stratum of BaO), the surface of the germanium substrate is cleaned to atomic cleanliness so that only germanium atoms are present at the substrate surface. To this end, the substrate surface is cleaned by a process commonly referred to as a Modified RCA technique. The Modified RCA technique is a well-known process involving the chemical production of an oxide at a germanium surface being cleaned and subsequently placing the surface in a high vacuum environment and raising the temperature of the surface to sublime the oxide off of the surface.

Figure 8:
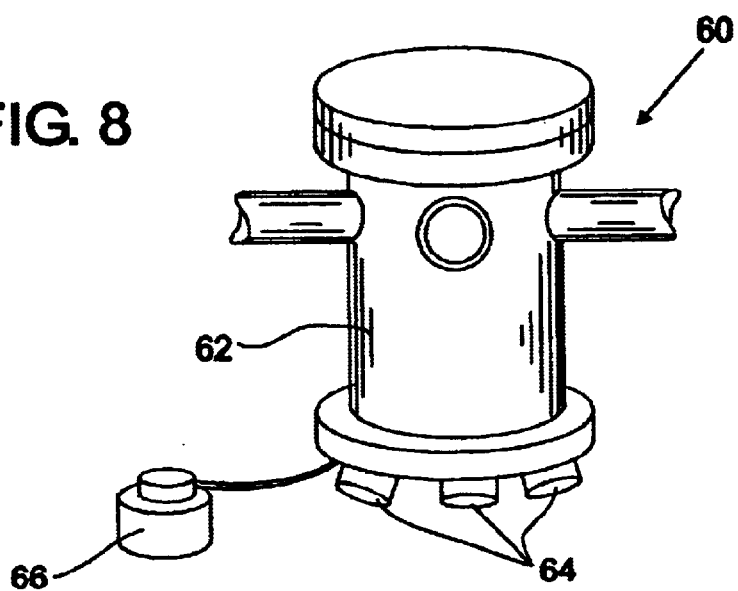
FIG. 8 is a schematic perspective view of ultra high vacuum equipment with which steps of the present invention can be performed.

The equipment used for creating a high vacuum environment about the germanium substrate is an ultra high vacuum (UHV) molecular beam epitaxy (MBE) facility, a fragment of which is indicated 60 in FIG. 8. The facility 60 includes a container 62 having an inner chamber within which the substrate is positioned so that its surface faces downwardly, and a plurality of canisters 64 are mounted within the base of the container 62 for providing a vapor source of metals desired to be added to the substrate surface during the process of the present invention. In this connection, each canister 64 is adapted to hold a crucible containing a desired metal and contains heating elements for vaporizing the metal. An opening is provided in the top of each canister 64, and a shutter is associated with the canister opening for movement between a closed condition at which the interior of the container 64 is closed and thereby isolated from the substrate surface and an opened condition at which the contents of the container 64, i.e., the metal vapor, is exposed to the substrate surface. In addition, an oxygen source 66 is connected to the container chamber so that by opening and closing a valve associated with the source 66, oxygen may be delivered to or shut off from the chamber. The opening and closing of each canister shutter and the oxygen source valve is accurately controlled by a computer controller (not shown).

One other feature of the facility 62 is that a closable substrate shutter is disposed immediately below the downwardly-directed face of the substrate surface for isolating, when desired, the substrate surface from exposure to the metal vapors from the canisters 64 or the oxygen from the oxygen source 66 while the internal pressure of the facility chamber is raised with the oxygen from the source 66. The substrate shutter is closed during one step of the present process as will be apparent herein.

The vacuum drawn in the UHV facility 62 to complete the Modified RCA cleaning technique upon the substrate is between about $10^{-9}$ and $10^{-10}$ torr, and the substrate is heated to raise the substrate surface temperature to a temperature sufficient to drive the oxides off of the substrate surface. In practice, such a temperature may be between about 300° C. and 600° C. for germanium, and the desired surface cleanliness may be confirmed in-situ during the substrate heating operation by Reflection High Energy Diffraction (RHEED) techniques. Briefly, a RHEED technique uses a high energy electron beam to diffract electrons off of the substrate surface at a glancing angle, typically 10 keV at an incidence angle of 1 to 2 degrees. The diffraction of the electrons provides crystallographic information while the limited penetration of the electron beam provides information relating to the flatness of the film surface. A flat surface is characterized by rods of scattered intensity perpendicular to the film intersecting the normal Bragg reflections of the crystal structure. For present purposes, the germanium substrate reaches atomic cleanliness upon the development of 2×1 Ge(100) at the surface 22 as evidenced by RHEED analysis.

At that point, the metal (or element) barium (Ba) is deposited upon the substrate surface of germanium (Ge) so that a fraction, e.g. about one-fourth, of a monolayer of Ba covers the substrate surface. In other words, the Ba metal is deposited upon the substrate surface until about one atom of the Ba metal overlies the germanium surface for every four atomic sites of Ge. To this end, a vapor of the metal Ba is created in one of the canisters 64 (FIG. 8) and the appropriate canister shutter is opened to expose the clean substrate surface to the vapor of Ba metal. As mentioned earlier, the operation of the canister shutter is controlled by a computer controller to accurately control the amount that the Ba metal is deposited upon the substrate surface. Once the exposure of the substrate to the Ba metal is sufficient to provide the desired fraction of the monolayer of the Ba metal, the canister shutter is closed. This fraction of the monolayer of Ba reacts with the germanium of the substrate surface to form the desired monolayer of germanide. The afore-described one-fourth monolayer of Ba is believed to result in the optimum germanide stoichiometry. However, a fraction of a monolayer of Ba in the range of between one-eighth and one-half of a monolayer is believed to provide a germanide stoichiometry which is consistent with the teachings of this principle.

The germanium substrate is then cooled to between about room temperature and 300° C. while the high vacuum environment is maintained about the substrate. This action enables the epitaxial growth of the crystalline oxide from the germanide template by co-depositing oxygen and Ba in appropriate proportions as the thin film BaO grows heteroepitaxially on the germanide.

To grow the BaO upon the substrate, the alkaline earth metal, Ba, is preferably deposited first upon the substrate in the absence of oxygen to between approximately three-eighths and one-half of a monolayer and then oxygen and Ba are co-deposited to an additional one-half monolayer to provide the first full monolayer of the alkaline earth oxide BaO. Thereafter, the growth of the alkaline earth oxide can be continued by alternately shuttering the alkaline earth and transition metal sources until a single plane layer of BaO has been formed on the germanium surface. During the deposition process involving the BaO single plane layer, careful control of the deposition process is maintained to ensure that no more than a single plane layer is deposited upon the germanium surface. This control of the deposition process decreases the likelihood that BaO will accumulate in clusters on the germanium surface.

By appropriately opening and closing off the exposure of the germanium surface to the Ba and oxygen or by cyclically exposing the substrate to the Ba and oxygen, BaO is grown upon the substrate surface one atomic layer at a time. Such a growth pattern is continued until the desired number (i.e., n) of monolayers upon the germanium substrate is attained.

When the desired number of single plane layers of BaO has been attained, steps are then taken to deposit the perovskite $BaTiO_3$ onto the stratum of BaO layers. In this connection and keeping in mind that the cubic crystalline form of $BaTiO_3$ is comprised of a plane of $TiO_2$ and a plane of the metal oxide BaO, an initial film comprised of a single plane of $TiO_2$ is grown commensurately upon the surface of the stratum of the BaO layers. To this end and while maintaining the internal pressure of the facility 62 between $2-5 \times 10^{-7}$ torr, Ti metal vapor could initially be deposited upon the surface of the BaO stratum and then oxygen from the source 66 could be released over the BaO surface so that the desired layer of $TiO_2$ is formed thereon. Alternatively, the BaO surface could be simultaneously exposed to Ti vapor and oxygen, in controlled amounts, so that $TiO_2$ forms and then accumulates on the BaO surface. As has been described in connection with the aforementioned deposition processes involving a single plane layer of BaO, careful control of the deposition process is maintained to ensure that no more than one plane of $TiO_2$ is deposited directly upon the BaO surface.

Following the development of the desired layer of $TiO_2$ upon the BaO surface, a single plane layer of BaO which comprises the other plane of the crystalline structure of the perovskite $BaTiO_3$ is grown upon the initial $TiO_2$ plane. As is the case with the formation of the BaO planes of the stratum of BaO layers, the BaO can be grown directly upon the $TiO_2$ plane by conventional MBE techniques. For example, the metal vapor Ba can be initially deposited upon the $TiO_2$ surface, and then the oxygen can be subsequently released into the chamber so that the metal oxide BaO forms upon the $TiO_2$ surface. Alternatively, the $TiO_2$ layer could be simultaneously exposed to metal vapor and oxygen so that the metal oxide BaO accumulates on the $TiO_2$ layer. Together, the underlying $TiO_2$ layer and the deposited BaO layer comprise a single layer of $BaTiO_3$ of one unit cell height.

Upon formation of the desired plane of metal oxide BaO, another plane of $TiO_2$ is grown upon the metal oxide plane in accordance with the aforedescribed techniques used to grow $TiO_2$ upon the exposed layer of BaO of the stratum of BaO single plane layers. Upon formation of the desired another plane of $TiO_2$, another plane of the metal oxide BaO is grown upon the second plane of $TiO_2$. This deposition process is accomplished between room temperature and 300° C. After m unit cells in the range $1 < m < 10$ are deposited at low temperature in oxygen, the oxygen is pumped out of the system to below $10^{-7}$ torr, and the substrate is then heated to between 400 and 800° C. where the perovskite fully orders thereby avoiding interdiffusion and degradation of the $(AO)_n$ underlayers.

Thereafter, single plane layers of $TiO_2$ and BaO are formed in alternating fashion until a desired number (i.e., m) of layers of the perovskite $BaTiO_3$ is grown upon the stratum of BaO single plane layers.

It has been found that by carrying out the deposition steps (i.e. those steps involving the build up of layers of the desired structure) within the (low temperature) range of between about room temperature and 400° C., the epitaxial growth of the layers is enhanced. If, for example, a $TiO_2$ layer is deposited upon a previously-deposited layer at high temperature (e.g. between about 400° and 850° C.), the element Ti could dissolve into (or be absorbed by) the previously-deposited layer.

It has also been found that epitaxial growth of the alternating single plane layers of $TiO_2$ and BaO can be enhanced by taking steps to normalize the atoms of each layer following the deposition of each layer. More specifically and following a deposition process in which either $TiO_2$ and BaO is deposited upon its preceding layer (and which is commonly carried out at a temperature of between room temperature and 400° C. and an oxygen pressure of between about $5 \times 10^{-8}$ torr and $1 \times 10^{-5}$ torr), the oxygen is preferably pumped out of the chamber 62 and then the substrate temperature is raised to a temperature of between 300° C. and 850° C. The higher temperature conditions are maintained for a preselected period of time (e.g. about 10 seconds) before the temperature of the substrate is permitted to drop to the lower temperature (of between room temperature and 300° C.) at which a subsequent single plane layer of BaO or $TiO_2$ is grown upon the previously-grown layer. It is believed that at the higher temperature conditions, atoms of the layer previously deposited in the structure more easily re-order themselves to a stable, desired relationship upon the previously-grown layer. In addition and following the deposition of a few layers of the constituent planes of BaO and $TiO_2$ of the perovskite $BaTiO_3$ upon the stratum of BaO single plane layers, $BaTiO_3$ can be deposited upon the previously-deposited layers by co-deposition of the layers of constituent planes of BaO and $TiO_2$ in an oxygen pressure in the range of between about $5 \times 10^{-8}$ torr to $1 \times 10^{-5}$ torr and a (substrate) temperature range of between about 300° C. and 850° C.

Although the aforedescribed deposition processes have been described as involving MBE deposition techniques, other growth techniques can now be employed, e.g. MOCVD, laser ablation, and sputter deposition. Additional information relative to the growth of perovskite oxides can be found in U.S. Pat Nos. 5,821,199 and 5,830,270, as well as co-pending patent application Ser. No. 09/650,340, the disclosures of which are incorporated herein by reference.

It follows from the foregoing that our COS structure series provides a means by which the electrical structure of the interface can be manipulated. The alkaline earth and perovskite oxides can be lattice matched and grown on silicon, germanium and alloys of the two in geometrical sequences generically represented by $(AO)_n(A'BO_3)_m$ in which n and m are lattice plane and unit cell repeat integers. If n=0 or 1 and $A'BO_3$ is $SrTiO_3$, then no barrier to electron transport is available and COSGATE™ will not function. Data are compiled as determined using the above expressions for CB and VB and tabulated in the table of FIG. 5; and these data can be used in designing the physical and electrical structure of COSGATE™.

It will be understood that numerous modifications and substitutions can be had to the aforedescribed embodiments without departing from the spirit of the invention. Accordingly, the aforedescribed embodiments are intended for the purpose of illustration and not as limitation.

What is claimed is:

1. A crystalline oxide-on-semiconductor structure comprising:
    a semiconductor-based substrate; and
    an epitaxial thin film directly overlying and in contact with the surface of the substrate wherein the thin film consists of a first stratum of single atomic plane layers of an alkaline earth oxide (AO) and a second stratum of single unit cell layers of an oxide material ($A'BO_3$) so that the multilayer film arranged upon the substrate surface can be designated $(AO)_n(A'BO_3)_m$ wherein n is a non-negative integer repeat of atomic plane layers of the AO alkaline earth oxide and in is a non-negative integer repeat of unit cell layers of the $A'BO_3$ oxide material and that n can be zero if m is a positive integer and the element A' of the $A'BO_3$ material consists of the element A of the alkaline earth oxide AO and so that there is no material disposed between the epitaxial thin film and the surface of the substrate; and
    wherein n and m have been selected to provide the structure with desired electrical structure at the substrate/thin film interface so that the greater the value of n selected or the greater the ratio of n to m based upon the selected values of n and m, the smaller the leakage current across the substrate/thin film interface.

2. The structure as defined in claim 1 wherein n and m have been selected to provide a ratio of n to m which is within the range of zero to ∞.

3. The structure as defined in claim 1 embodied in a COS capacitor wherein the value of n is selected to provide a leakage current of between 10 and $10^{-a}$ amps/cm$^2$ for a gate voltage of between −1 and +1 volts.

4. The structure as defined in claim 1 wherein the semiconductor-based substrate is comprised of silicon, germanium or a silicon-germanium alloy.

5. The structure as defined in claim 1 wherein each layer of the first and second epitaxial stratums is Commensurate with the underlying substrate.

6. A crystalline oxide-on-semiconductor structure comprising:
    a semiconductor-based substrate; and
    an epitaxial thin film overlying the surface of the substrate so as to be in direct contact with the substrate surface wherein the thin film consists of a first stratum of single atomic plane layers of an alkaline earth oxide (AO) and a second stratum of single unit cell layers of an oxide material ($A'BO_3$) so that the multilayer film arranged upon the substrate surface can be designated $(AO)_n(A'BO_3)_m$ wherein n is a non-negative integer repeat of atomic plane layers of the AO alkaline earth oxide and m is a non-negative integer repeat of unit cell layers of the $A'BO_3$ oxide material and so that there is no material disposed between the epitaxial thin film and the surface of the substrate; and
    wherein the value of n has been selected to provide the structure with desired electrical characteristics at the substrate/thin film interface so that the greater the value of n selected, the smaller the leakage current across the substrate/thin film interface.

7. The structure as defined in claim 6 wherein the semiconductor-based substrate is comprised of silicon, germanium or a silicon-germanium alloy.

8. The structure as defined in claim 6 wherein each layer of the first and second stratums is commensurate with the underlying substrate.

9. In a process for growing an epitaxial crystalline oxide thin film upon the surface of a semiconductor-based substrate according to claim 1 wherein the thin film has the general formula $(AO)_n(A'BO_3)_m$ wherein n designates the number of single atomic plane layers of the alkaline earth oxide AO grown directly over the semiconductor-based substrate and a designates the number of single unit cell layers of the oxide material $A'BO_3$ grown directly over the n layers of the alkaline earth oxide AO, the improvement comprising the steps of
    selecting the value of n and a prior to the build up of n atomic plane layers of alkaline earth oxide AO and m unit cell layers of the oxide material $A'BO_3$ so that the resultant crystalline oxide thin film is provided with desired electrical characteristics at the substrate/thin-film interface.

10. The improvement of claim 9 wherein the semiconductor-based substrate is comprised of silicon, germanium or a silicon-germanium alloy.

11. In a process for growing an epitaxial crystalline oxide thin film upon the surface of a semiconductor-based substrate according to claim 9 wherein the thin film has the general formula $(AO)_n(A'BO_3)_m$ wherein n designates the number of single atomic plane layers of the alkaline earth oxide AO grown directly over the semiconductor-based substrate and m designates the number of single unit cell layers of the oxide material $A'BO_3$ grown directly over the n layers of the alkaline earth oxide AO and the process involves the depositing of each layer of either the AO oxide or a film comprising a constituent plane of the $A'BO_3$ material at a substrate temperature of between room temperature and 400° C., the improvement comprising the step of
    raising the temperature of the substrate to an elevated temperature of between 400° C. and 850° C.; and
    maintaining the substrate at the elevated temperature for a few seconds before returning the substrate to the lower temperature conditions of between room temperature and 400° C. for a subsequent deposition step.

12. The improvement of claim 11 wherein the substrate is maintained at the elevated temperature for about ten seconds during the maintaining step before the substrate is returned to the lower temperature conditions for a subsequent deposition step.

* * * * *